United States Patent
Hsu et al.

(10) Patent No.: US 9,780,169 B2
(45) Date of Patent: Oct. 3, 2017

(54) SEMICONDUCTOR STRUCTURE HAVING EPITAXIAL LAYERS

(71) Applicant: UNITED MICROELECTRONICS CORP., Hsin-Chu (TW)

(72) Inventors: Chih-Kai Hsu, Tainan (TW); Yu-Hsiang Hung, Tainan (TW); Ssu-I Fu, Kaohsiung (TW); Yu-Cheng Tung, Kaohsiung (TW); Jyh-Shyang Jenq, Pingtung County (TW)

(73) Assignee: UNTIED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/876,844

(22) Filed: Oct. 7, 2015

(65) Prior Publication Data

US 2017/0077229 A1    Mar. 16, 2017

(30) Foreign Application Priority Data

Sep. 11, 2015    (CN) .......................... 2015 1 0577437

(51) Int. Cl.
*H01L 29/08*    (2006.01)
*H01L 29/78*    (2006.01)
*H01L 27/092*    (2006.01)

(52) U.S. Cl.
CPC ...... *H01L 29/0847* (2013.01); *H01L 27/0924* (2013.01); *H01L 29/785* (2013.01)

(58) Field of Classification Search
CPC ........... H01L 29/66795; H01L 27/0886; H01L 21/823431; H01L 27/0924; H01L 29/785; H01L 27/088; H01L 29/0847
See application file for complete search history.

(56) References Cited

U.S. PATENT DOCUMENTS

| | | | |
|---|---|---|---|
| 8,362,575 B2 | 1/2013 | Kwok | |
| 8,426,923 B2 | 4/2013 | Lee | |
| 2015/0255543 A1* | 9/2015 | Cheng | ................. H01L 29/7848 257/288 |
| 2015/0325646 A1* | 11/2015 | Lai | ....................... H01L 29/7851 257/369 |

(Continued)

OTHER PUBLICATIONS

Feng, Title of Invention: Semiconductor Structure and Manufacturing Method Thereof, U.S. Appl. No. 14/817,217, filed Aug. 4, 2015.

(Continued)

*Primary Examiner* — Marcos D Pizarro
*Assistant Examiner* — Shannon Yi
(74) *Attorney, Agent, or Firm* — Winston Hsu

(57) ABSTRACT

The present invention provides a semiconductor structure, including a substrate having a first conductivity region and a second conductivity region defined thereon, a plurality of first fin structures and at least one first gate structure disposed on the substrate and within the first conductivity region, a plurality of second fin structures and at least one second gate structure disposed on the substrate and within the second conductivity region, at least two first crown epitaxial layers disposed within the first conductivity region, a plurality of second epitaxial layers disposed within the second conductivity region, where the shape of the first crown epitaxial layer is different from that of the second epitaxial layer.

10 Claims, 9 Drawing Sheets

(56) References Cited

U.S. PATENT DOCUMENTS

| | | | |
|---|---|---|---|
| 2016/0093726 A1* | 3/2016 | Ching | H01L 29/785 257/192 |
| 2016/0093738 A1* | 3/2016 | Xie | H01L 29/7848 257/77 |
| 2016/0104701 A1* | 4/2016 | Yoo | H01L 27/0274 361/56 |
| 2016/0118462 A1* | 4/2016 | Tseng | H01L 29/66795 257/386 |
| 2016/0284705 A1* | 9/2016 | Chung | H01L 27/0924 |

OTHER PUBLICATIONS

Hsu, Title of Invention: FINFET and Method of Fabricating the Same, U.S. Appl. No. 14/818,322, filed Aug. 5, 2015.

* cited by examiner

SEMICONDUCTOR STRUCTURE HAVING EPITAXIAL LAYERS

BACKGROUND OF THE INVENTION

1. Field of the Invention

The invention relates to a semiconductor structure and fabrication method thereof, and more particularly, to a semiconductor structure having a plurality of different epitaxial layers.

2. Description of the Prior Art

With the trend in the industry being towards scaling down the size of the metal oxide semiconductor transistors (MOS), three-dimensional or non-planar transistor technology, such as fin field effect transistor (FinFET) technology has been developed to replace planar MOS transistors. Since the three-dimensional structure of a FinFET increases the overlapping area between the gate and the fin structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the finFET can be controlled by adjusting the work function of the gate.

Nevertheless, conventional FinFET fabrication of forming recesses after removing part of fin structures to accommodate the growth of epitaxial layer typically causes the fin structures to be lower than the surrounding shallow trench isolation (STI) as a result of over-etching, thereby influencing the formation of epitaxial layer afterwards. Hence, how to improve the current FinFET fabrication process for resolving this issue has become an important task in this field.

SUMMARY OF THE INVENTION

The present invention provides a semiconductor device, comprising: a substrate, a first conductivity type region and a second conductivity type region being defined thereon, a plurality of first fin structures disposed on the substrate and disposed within the first conductivity type region, a plurality of second fin structures disposed on the substrate and disposed within the second conductivity type region, a plurality of first gate structures disposed within the first conductivity type region, across and over the first fin structures, and a plurality of second gate structures disposed within the second conductivity type region, across and over the second fin structures, and at least two first crown epitaxial layers, disposed within the first conductivity type region and disposed on two sides of each first gate structure, and a plurality of second epitaxial layers, disposed within the second conductivity type region and disposed on two sides of each second gate structure, wherein the first crown epitaxial layers are disposed in a first recess on two sides of the first gate structure, the first recess has a flat bottom surface, and contacts a plurality of first fin structures, in addition, the shape of the second epitaxial layer is different from the shape of the first crown epitaxial layer.

The present invention also provides a semiconductor device, comprising: a substrate, a first conductivity type region being defined thereon, the first conductivity type region including a first region and a second region, a plurality of first fin structures disposed on the substrate and disposed within the first region, a plurality of second fin structures disposed on the substrate and disposed within the second region, a plurality of first gate structures disposed within the first region, across and over the first fin structures, and a plurality of second gate structures disposed within the second region, across and over the second fin structures, and at least two first crown epitaxial layers, disposed within the first region and disposed on two sides of each first gate structure, and a plurality of second epitaxial layers, disposed within the second region and disposed on two sides of each second gate structure, wherein the first crown epitaxial layers are disposed in a first recess on two sides of the first gate structure, the first recess has a flat bottom surface, and contacts a plurality of first fin structures, in addition, the shape of the second epitaxial layer is different from the shape of the first crown epitaxial layer.

The key feature of the present invention is the epitaxial layers with different shapes are disposed within different conductivity type regions of one semiconductor device, or the epitaxial layers with different shapes are disposed within one conductivity type region of one semiconductor device. By combining the epitaxial layers with different shapes in one semiconductor device, this improves the flexibility in the application.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
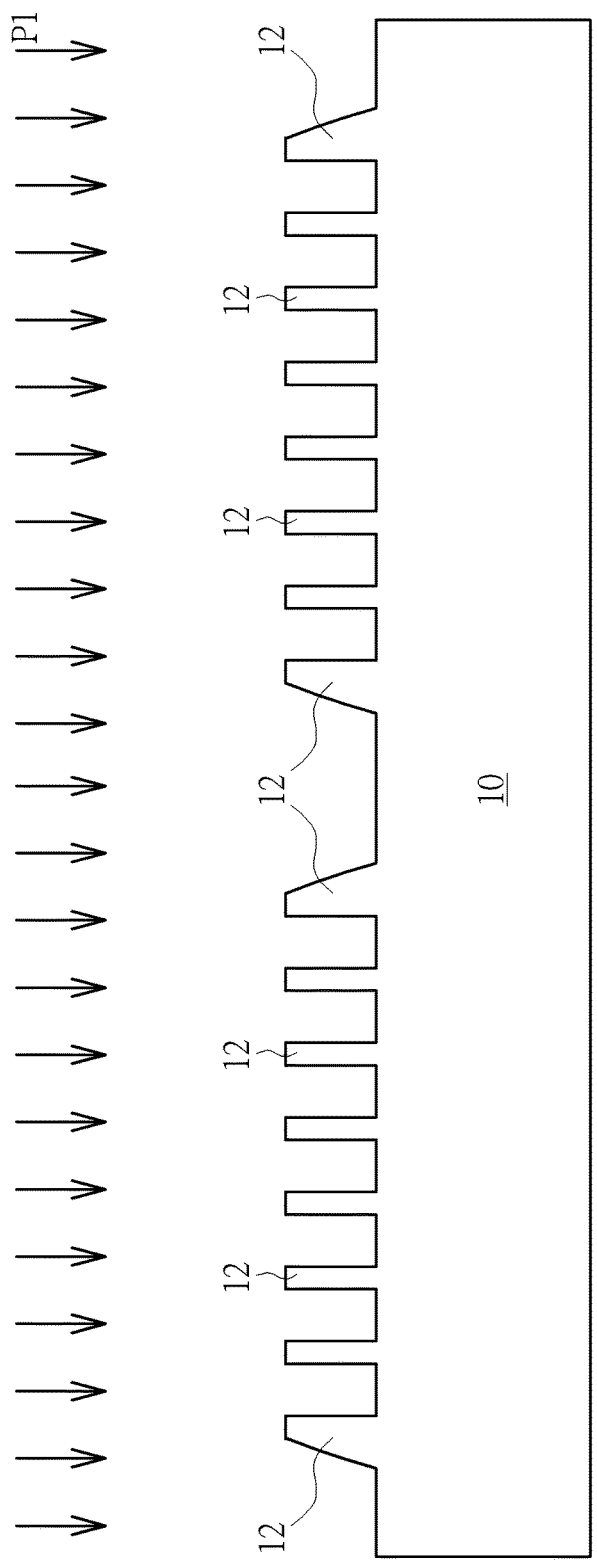
FIG. 1 to FIG. 3 are cross section schematic diagrams showing the semiconductor structure according to a first preferred embodiment of the present invention.

FIG. 1 to FIG. 6 are schematic diagrams showing a method for fabricating a semiconductor structure according to a first preferred embodiment of the present invention. Please refer to FIG. 1. FIG. 1 is a schematic diagram showing a semiconductor structure at the beginning of the fabrication process. As this stage, a semiconductor structure having a substrate 10 and a plurality of fin structures 12 disposed thereon is provided. In addition, the substrate 10 may be chosen from a semiconductor substrate such as a bulk silicon substrate, a silicon containing substrate, a III-V semiconductor-on-silicon (such as GaAs-on-silicon) substrate, a graphene-on-silicon substrate, a silicon-on-insulator (SOI) substrate, a silicon dioxide substrate, an aluminum oxide substrate, a sapphire substrate, a germanium containing substrate or an alloy of silicon and germanium substrate.

More precisely, the method for fabricating the fin structures 12 may include the following processes, but not limited thereto. First, a bulk substrate (not shown) is provided and a hard mask layer (not shown) is formed thereon. The hard mask layer is then patterned through a photolithographic and an etching process (photo-etching process), so as to define the location for forming fin structures 12 in the bulk substrate. Afterwards, an etching process P1 is performed to form fin structures 12 in the bulk substrate. After the above processes, the fabrication method for the fin structures 12 is complete. In this case, the fin structures 12 may be regarded as protruding from the surface of the substrate 10 and the compositions of the fin structures 12 and the substrate 10 may be the same, such as monocrystalline silicon. In another case, when the substrate is chosen from a III-V semiconductor-on-silicon substrate rather than the above-mentioned bulk silicon substrate, the main compositions of the fin structures may be the same as that of the III-V semiconductor and differ from that of the underlying substrate.

Figure 2:
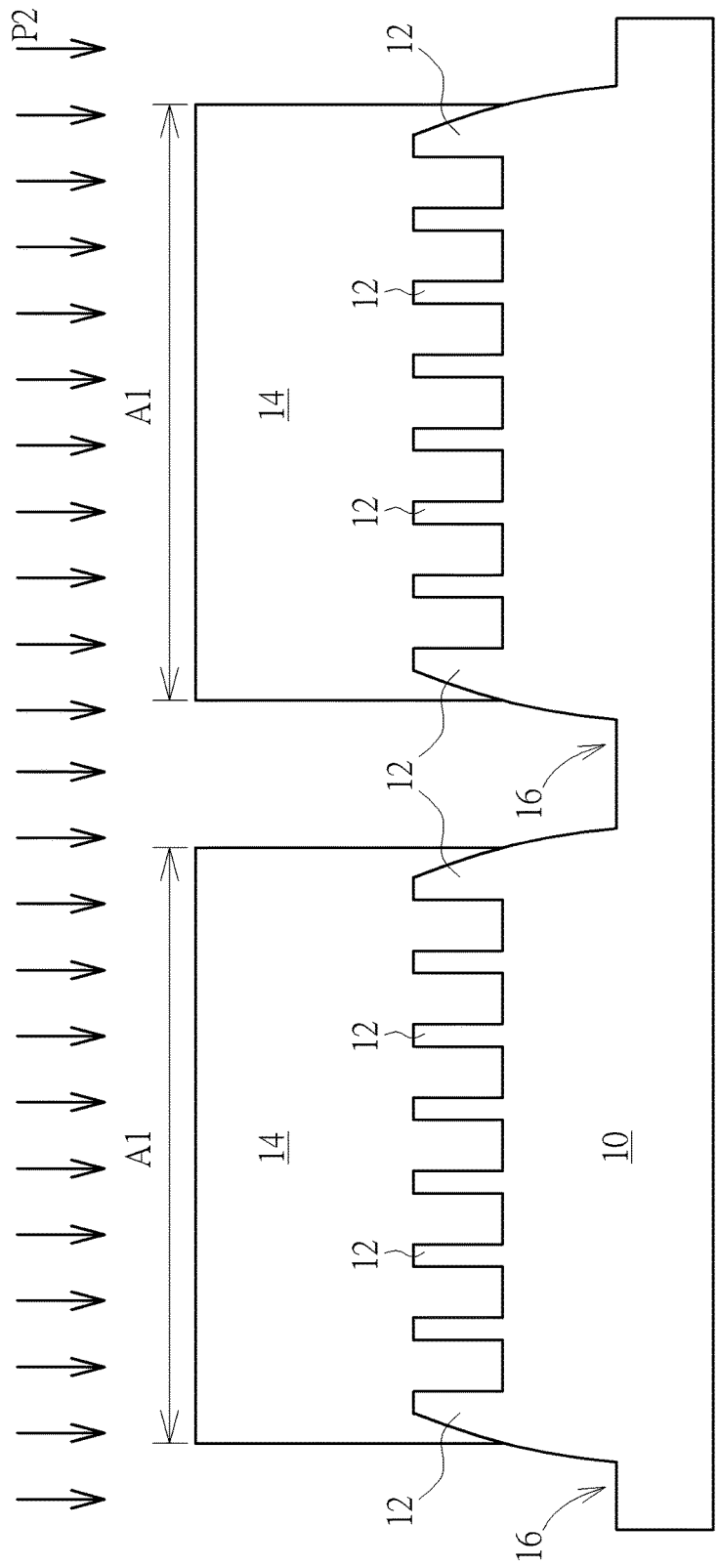

Next, a photoresist layer 14 is used as the hard mask to perform a fin-cut process. As shown in FIG. 2, after the fin-cut process P2 is performed, parts of the fin structure 12 and parts of the substrate are removed, and the recess 16 is therefore formed. Generally, the recess 16 will be filled with the insulating layer in the following steps, so as to form a shallow trench isolation (STI). The region A1 which is surrounded by the recess 16 can be defined as the active area of the semiconductor device, namely the region comprising the semiconductor device such as transistors disposed therein.

Figure 3:
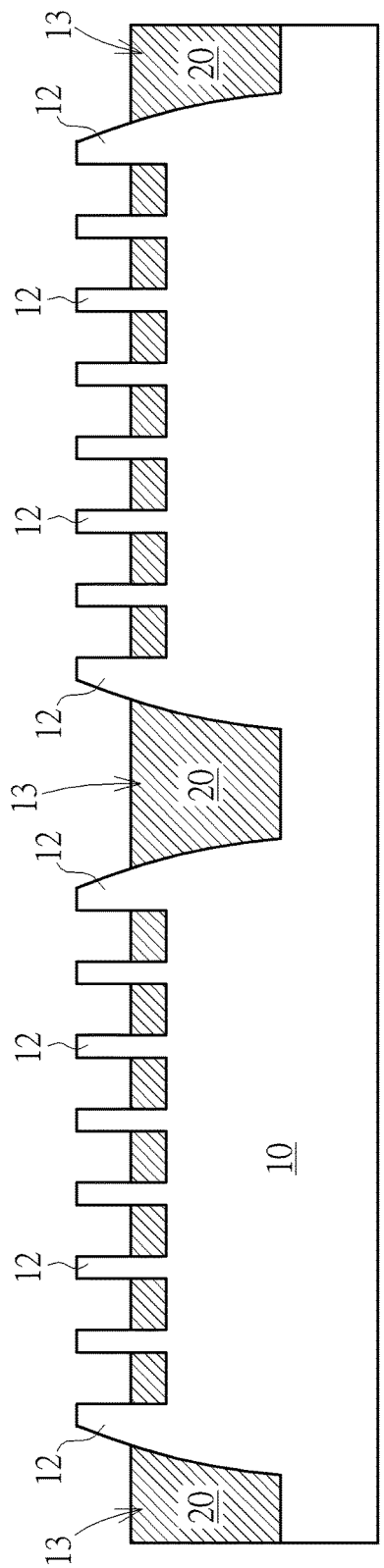

As shown in FIG. 3, after the photoresist layer 14 is removed, a flat insulating layer 20 is entirely formed on the substrate 10, covering the surface of the substrate 10 and also filling in the recesses 16. The insulating layer 20 comprises insulating materials such as silicon oxide or silicon nitride. Besides, before the insulating layer 20 is formed, a liner can be selectively formed between the substrate 10 and the insulating layer 20, and it should also be within the scope of the present invention.

Figure 4:
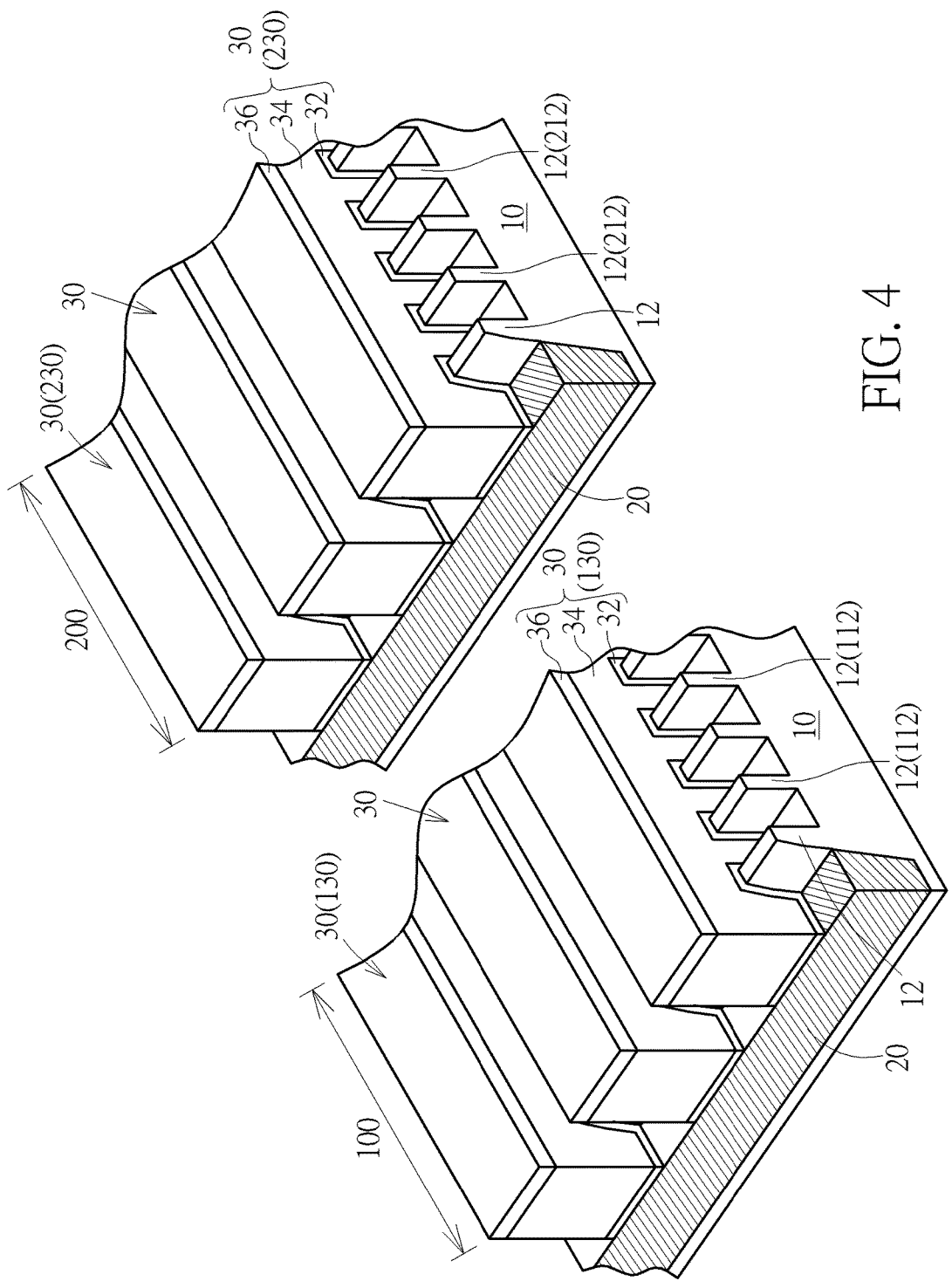
FIG. 4 is a 3D schematic diagram showing the semiconductor structure according to a first preferred embodiment of the present invention.

FIG. 4 is a 3D (three dimensional) schematic diagram showing the semiconductor structure according to a first preferred embodiment of the present invention. As shown in FIG. 4, a plurality of gate structures 30 are formed on the insulating layer 20 and cross over each fin structure 12. Each gate structure 30 includes a gate dielectric layer 32, a gate conductive layer 34 and a cap layer 36. The material of the gate dielectric layer 32 may include silicon oxide (SiO), silicon nitride (SiN), silicon oxynitride (SiON), or a high-k dielectric material having a dielectric constant (k value) larger than 4 such as metallic oxide, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZrxTi_{1-x}O_3$, PZT), barium strontium titanate ($BaxSr_{1-x}TiO_3$, BST) or a combination thereof. The material of the gate conductive layer 34 may include undoped polysilicon, heavily doped polysilicon, or one or a plurality of metal layers such as a work function metal layer, a barrier layer and a low-resistance metal layer, etc. The cap layer 36 may include a single-layer structure or multi-layer structure made of dielectric materials such as silicon oxide (SiO), silicon nitride (SiN), silicon carbide (SiC), silicon carbonitride (SiCN), silicon oxynitride (SiON) or a combination thereof. Besides, spacers should also be included and disposed on two sides of the gate structure 30, but in order to simplify the figure, spacers are not shown in FIG. 4.

Until this step, a plurality of fin structures 12 of the semiconductor device of the present invention are formed on the substrate 10, and a plurality of gate structures 30 are also formed on the substrate 10, and each gate structure 30 is disposed at least across and over one fin structure 12. Next, at least one first conductivity type region 100 and at least one the second conductivity type region 200 are defined on the substrate, and a shallow trench isolation (STI) is disposed between the first conductivity type region 100 and the second conductivity type region 200. Both the first conductivity type region 100 or the second conductivity type region 200 respectively comprise at least one fin structure and at least one gate structure disposed therein. In order to describe more clearly, in the following paragraphs, the fin structures 12 within the first conductivity type region 100 is labeled as the fin structures 112, the gate structure 30 disposed within the first conductivity type region 100 is labeled as the gate structure 130, the fin structures 12 within the second conductivity type region 200 is labeled as the fin structures 212, the gate structure 30 disposed within the second conductivity type region 200 is labeled as the gate structure 230, the structure of the fin structures 112, 212 and the gate structure 130, 230 are the same as the fin structures 12 and the gate structure 30 mentioned above, and will not be redundantly described here.

Figure 5:
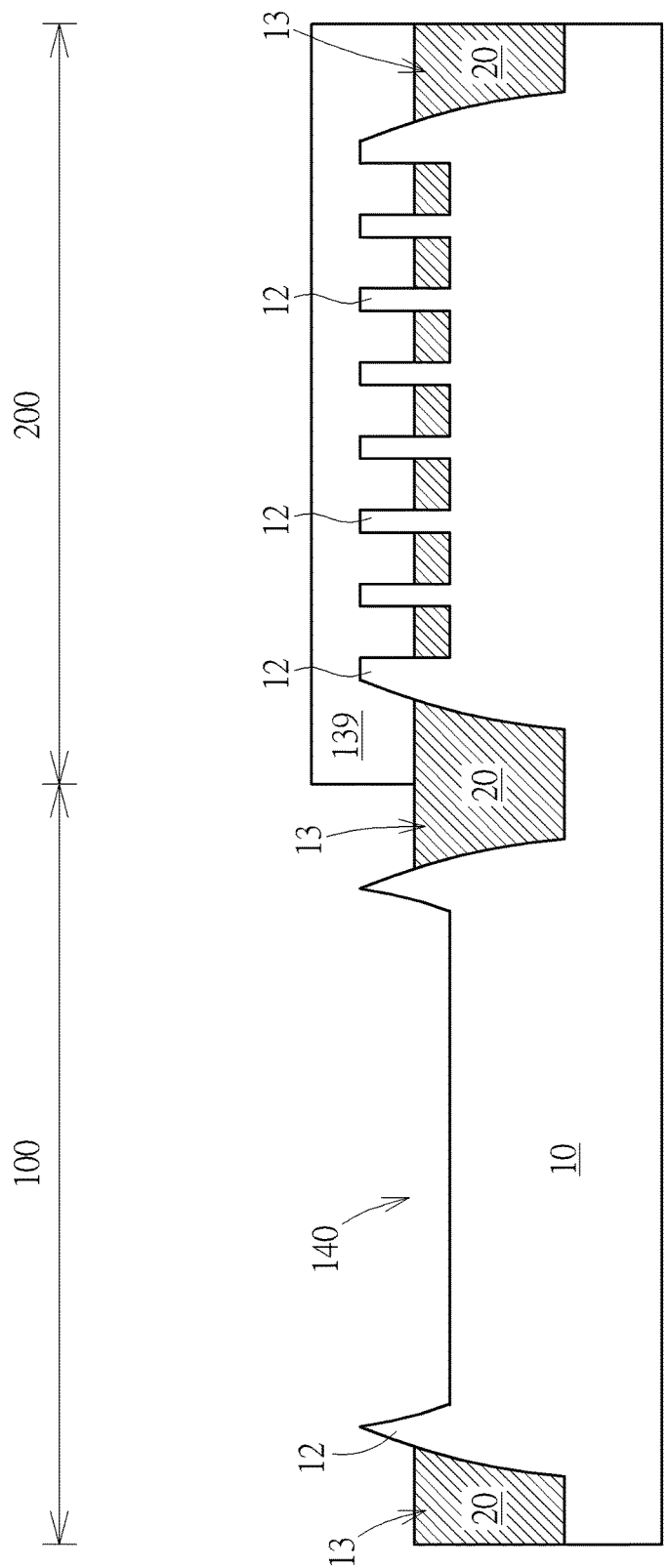
FIG. 5 to FIG. 6 are cross section schematic diagrams showing the semiconductor structure according to a first preferred embodiment of the present invention.
Figure 6:
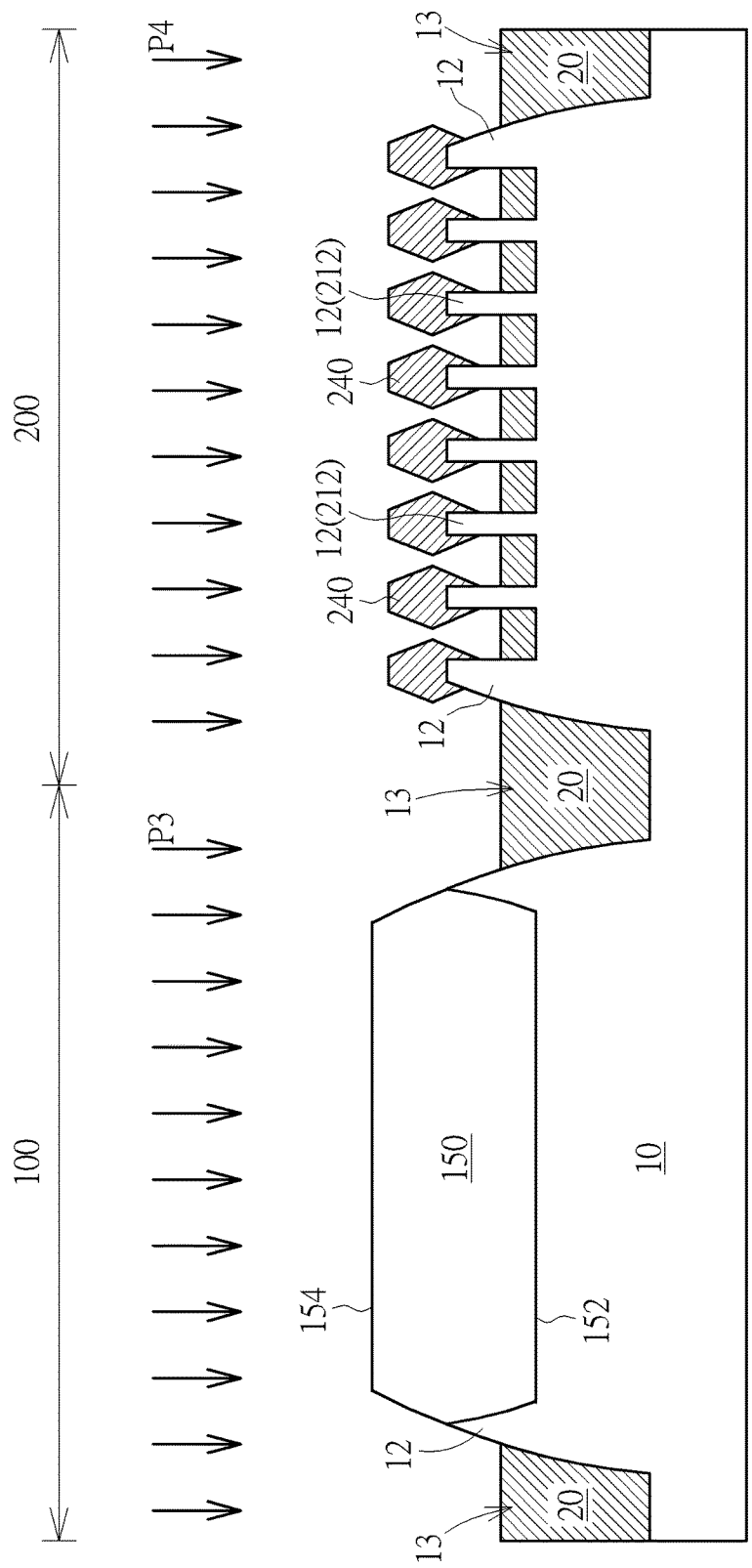

In the present invention, the first conductivity type region 100 maybe a n-type transistor region, and at least n-type transistor will be formed within the first conductivity type region 100 in the following steps, or it maybe a p-type transistor region, and at least p-type transistor will be formed within the first conductivity type region 100 in the following steps. Similarly, the second conductivity type region 200 may be an n-type transistor region or a p-type transistor region. Preferably, the transistors within the first conductivity type region 100 and within the second conductivity type region 200 are complementary to each other. For example, if the first conductivity type region 100 is an n-type transistor region, then the second conductivity type region 200 will be a p-type transistor region, but not limited thereto. The epitaxial layers within the first conductivity type region 100 and within the second conductivity type region 200 will be described in the following paragraphs:

1. Crown Epitaxial Layer:

Please refer to FIGS. 5-6, and further refer to FIGS. 3-4 mentioned above. FIGS. 5-6 show the cross section diagram of the semiconductor device according to the first preferred embodiment of the present invention. The crown epitaxial layer 150 is formed within the first conductivity type region 100. The method for forming the crown epitaxial layer 150 includes forming a hard mask 139 with an opening, at least covering parts of the fin structures (such as covering the fin structures within second conductivity type region 200), Next, an etching process is performed (such as reactive ion etching), so as to remove parts of the fin structures 112. In this step, only the fin structures that are disposed under the gate structure 130 (please also refer to FIG. 4) are protected and not removed, other exposed fin structures are removed completely. Therefore, after the etching process, two recesses 140 are formed (FIG. 5 only shows one of the recesses 140), disposed on two sides of the gate structure. The recess 140 has a flat bottom surface, and a plurality of fin structures are exposed by the recess 140. In other words, the recess 140 contacts a plurality of fin structures.

Next, a selective epitaxial growth (SEG) method P3 is performed to form a crown epitaxial layer 150 in the recess 140, the crown epitaxial layer 150 disposed on two sides of the gate structure 130. In one case, the crown epitaxial layer 150 may include a silicon-germanium epitaxial layer suited for a PMOS transistor, or a silicon-carbide epitaxial layer suited for an NMOS transistor, depending upon the electrical properties of the Multi-gate MOSFET. It is well-known to those skilled in the art that in the SEG method P3, the crown epitaxial layer 150 is to grow along each surface of the recess 140, but not grow along the surface of the insulating layer. Therefore, the crown epitaxial layer 150 fills up the recess 140. Preferably, the crown epitaxial layer 150 has a flat bottom surface 152 and a flat top surface 154, but not limited thereto. In addition, since the fin structures 112 are only disposed beside the recess 140 (disposed under the gate structure 130), and not disposed in the recess 140, even though the crown epitaxial layer 150 is disposed beside a plurality of fin structures 112 and directly contacts the fin structures 112, it does not cover on/above the fin structures 112.

It is noteworthy that, in this, embodiment, the crown epitaxial layer 150 is disposed within the first conductivity type region 100, but is not limited thereto. The crown epitaxial layer 150 may also be disposed within other regions, and it should also be within the scope of the present invention.

2. Sub-Epitaxial Layer

Please still refer to FIGS. 5-6, and further refer to FIGS. 3-4 mentioned above. Within the second region, a plurality of sub-epitaxial layers 240 are formed, disposed beside the gate structure 230 (the position of the gate structure is shown in FIG. 4), and covers on each fin structure 212. The difference between the method for forming the sub-epitaxial layers 240 and the method for forming the crown epitaxial layer 150 is that, there is no need to perform an etching process to remove the fin structures during the process for forming the sub-epitaxial layer 240, and a selective epitaxial growth (SEG) method P4 can be performed directly, so as to form the sub-epitaxial layers 240 on each fin structure 212. In one case, the sub-epitaxial layer 240 may include a silicon-germanium epitaxial layer suited for a PMOS transistor, or a silicon-carbide epitaxial layer suited for an NMOS transistor, depending upon the electrical properties of the Multi-gate MOSFET.

It is noteworthy that, in this embodiment, within the second conductivity type region 200, since the fin structures 212 are not being removed, the sub-epitaxial layer 240 at least partially covers three surfaces of the fin structure 212, including a top surface and two sidewalls. In another case, by adjusting the parameters of the SEG P4 (such as the process time, etc . . . ), this may cause each sub-epitaxial layer 240 to become merged with or separated from each other. It is well-known to those skilled in the art, and will not be redundantly described here.

Figure 7:
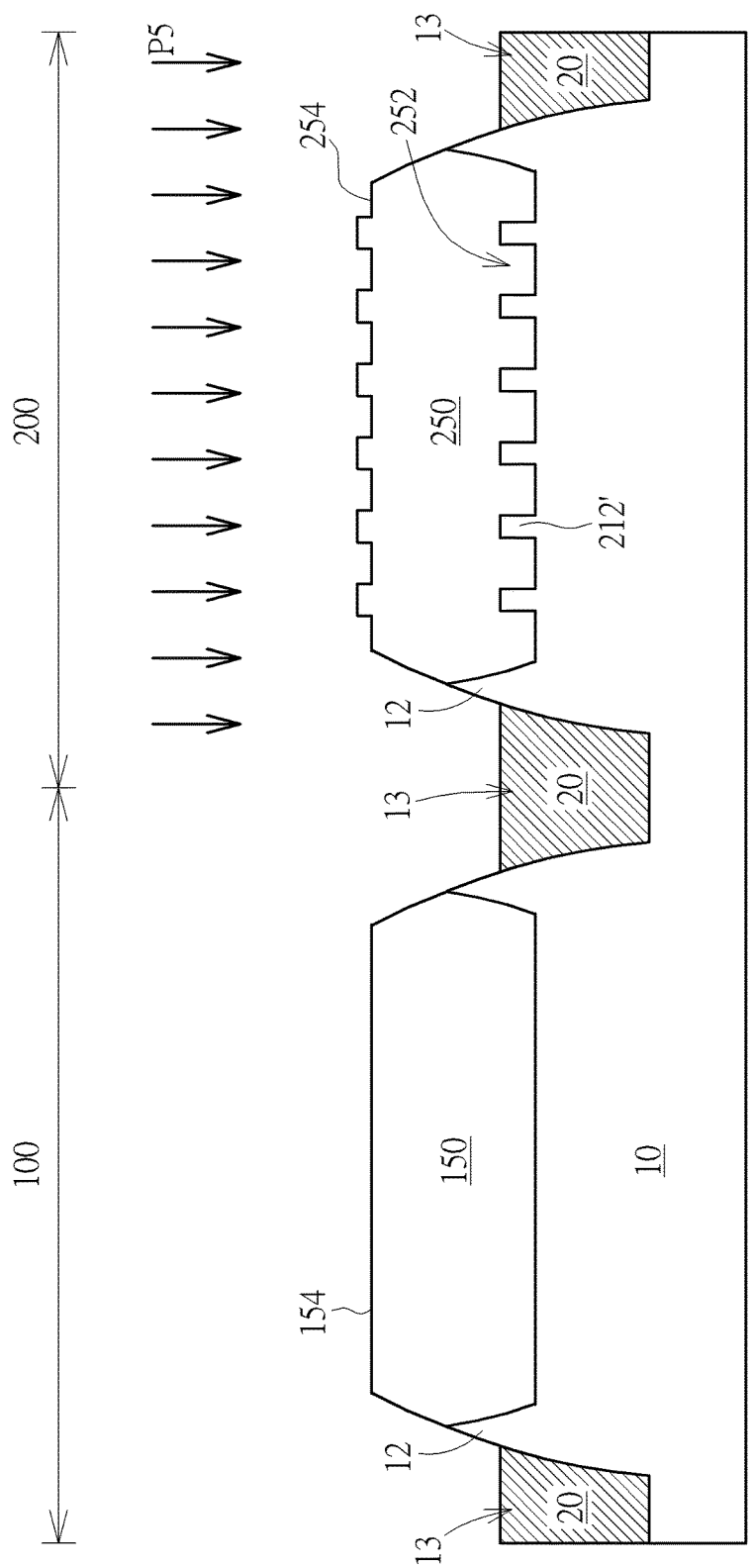
FIG. 7 shows the cross section diagram of the semiconductor structure according to the second preferred embodiment of the present invention.

3. Teeth Epitaxial Layer:

Please refer to FIG. 7, and further refer to FIGS. 3-4 mentioned above. FIG. 7 shows the cross section diagram of the semiconductor device according to the second preferred embodiment of the present invention. Having the crown epitaxial layer 150 formed within the first conductivity type region 100, the method for forming the crown epitaxial layer 150 has been described in the first preferred embodiment, and will not be described here. In this embodiment, at least two teeth epitaxial layers 250 are formed beside the gate structure 230 (the position of the gate structure is shown in FIG. 4), and the method for forming the teeth epitaxial layer is similar to that of the crown epitaxial layer, including forming a hard mask (not shown) with an opening, at least covering parts of the fin structures 112. Next, an etching process is performed (such as reactive ion etching), so as to remove parts of the fin structures 212. In this step, the fin structures that are disposed under the gate structure 230 (please also refer to FIG. 4) are protected and not removed. Other exposed fin structures are partially removed, so as to form a plurality of sub-fin structures 212', each sub-fin structure 212' being extend from the fin structures 212 that are disposed right under the gate structure 230 and is not removed, the height of the sub-fin structures 212' being lower than the height of the second fin structure 212. Therefore, after the etching process is performed, at least two recesses 252 (FIG. 6 only shows one of them) are formed and disposed on two sides of the gate structure 230. The recess 252 comprises a plurality of sub-fin structures 212' disposed therein.

A selective epitaxial growth (SEG) method P5 is performed to form a teeth epitaxial layer 250 in the recess 252, and the epitaxial layer 250 on two sides of the gate structure 230. In one case, the teeth epitaxial layer 250 may include a silicon-germanium epitaxial layer suited for a PMOS transistor, or a silicon-carbide epitaxial layer suited for an NMOS transistor, depending upon the electrical properties of the Multi-gate MOSFET. It is well-known to those skilled in the art that in the SEG method P5, the epitaxial layer 250 is to grow along each surface of the recess 252, and since the sub-fin structures 212' are disposed in the recess 252, the epitaxial layer 250 fills up the recess 252, and a top surface 254 of the teeth epitaxial layer 250 includes a recessed and protruding profile. In addition, the epitaxial layer 250 covers and is disposed right above the sub-fin structures 212', and is disposed beside the fin structures 212.

Figure 8:
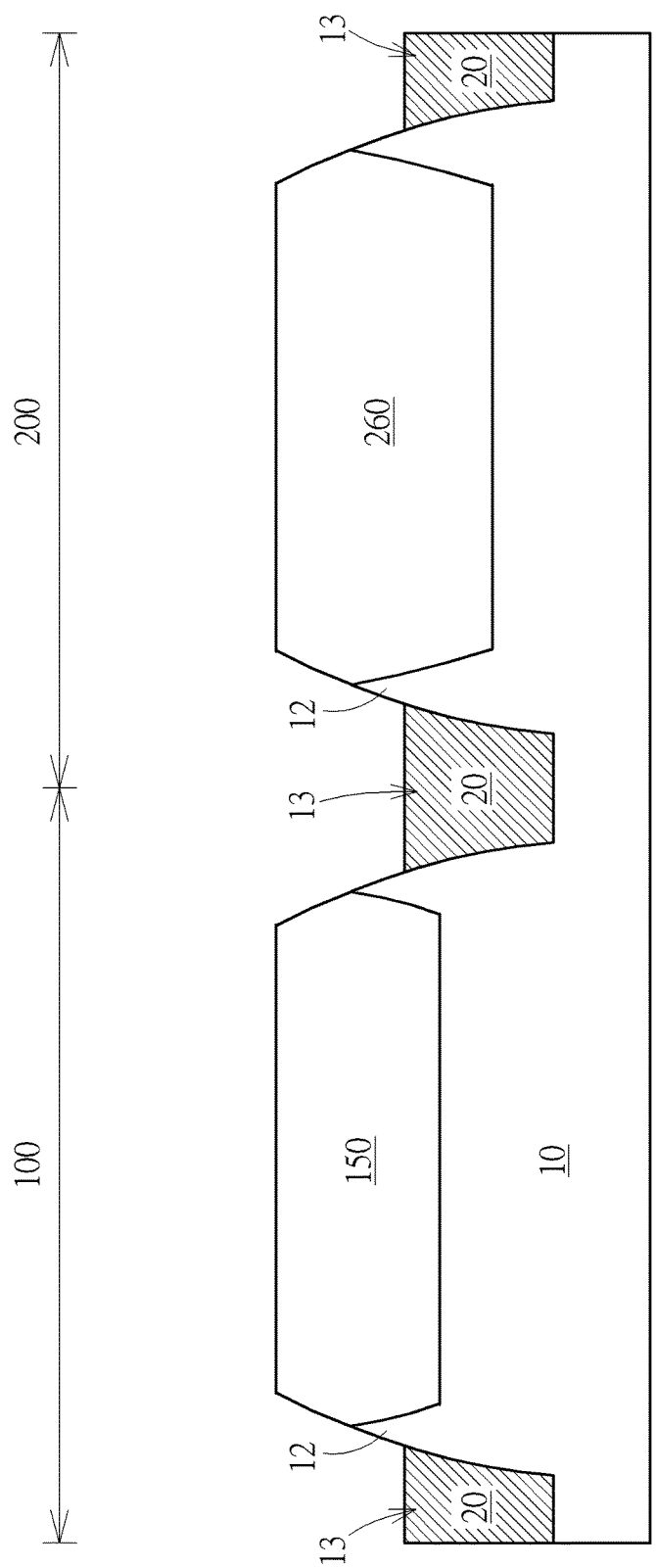
FIG. 8 shows the cross section diagram of the semiconductor structure according to the third preferred embodiment of the present invention.

Please refer to FIG. 8, and further refer to FIGS. 3-4 mentioned above. FIG. 8 shows the cross section diagram of the semiconductor device according to the third preferred embodiment of the present invention. The crown epitaxial layer 150 is formed in the first conductivity type region 100. The method for forming the crown epitaxial layer 150 has been described in the first preferred embodiment, and will not be described here. And a plurality of crown epitaxial layers 260 are formed within the second conductivity type region 200, and the method for forming them is the same as that of the crown epitaxial layer 150, but in this embodiment, by adjusting the depth of the recesses, the thickness of the crown epitaxial layer 150 is different from the thickness of the crown epitaxial layer 260. It is noteworthy that, the epitaxial layers with different shapes mentioned in other embodiments can also be combined with this embodiment. In other words, the thickness of each epitaxial layer can be changed by adjusting the process parameters. For example, in one embodiment, a teeth epitaxial layer is disposed within one conductivity type region, and another teeth epitaxial layer with different thickness is formed within another conductivity type region, and this should also be within the scope of the present invention.

In addition, each embodiment mentioned above can be combined with each other. For example, in one case, a plurality of sub-epitaxial layers are disposed within one conductivity type region, and a teeth epitaxial layer is disposed within another conductivity type region. If the structure satisfies the condition that one semiconductor structure includes epitaxial layers with different shapes, it should be within the scope of the present invention.

Besides, in each embodiment mentioned above, the epitaxial layers with different shapes are disposed within different conductivity type regions respectively, but the present invention is not limited thereto. The epitaxial layer with different shapes can also be disposed within a same conductivity type region. Please refer to FIG. 9, which shows the cross section diagram of the semiconductor device according to the fourth preferred embodiment of the present invention. In this embodiment, the substrate 10 includes a plurality of fin structures 12 and gate structures (not shown in FIG. 9, please refer to FIG. 4 mentioned above) disposed thereon, and the first conductivity type region 100 comprises a plurality of regions, such as the first region 100A, the second region 100B, the third region 100C and the fourth region 100D, each region being separated from each other by the STI 13. In this embodiment, the first region 100A comprises at least one crown epitaxial layer 150A disposed therein, the second region 100B comprises at least one sub-epitaxial layer 240B disposed therein, the third region 100C comprises at least one teeth epitaxial layer 250C disposed therein, and the fourth region 100D comprises at least one crown epitaxial layer 260D disposed therein, wherein the thickness of the crown epitaxial layer 260D is different from the thickness of the crown epitaxial layer 150A. The structures or the methods for forming the crown epitaxial layer, the sub-epitaxial layer and the teeth epitaxial of embodiment are the same as that of in the first to third preferred embodiments, and will not be described here.

Figure 9:
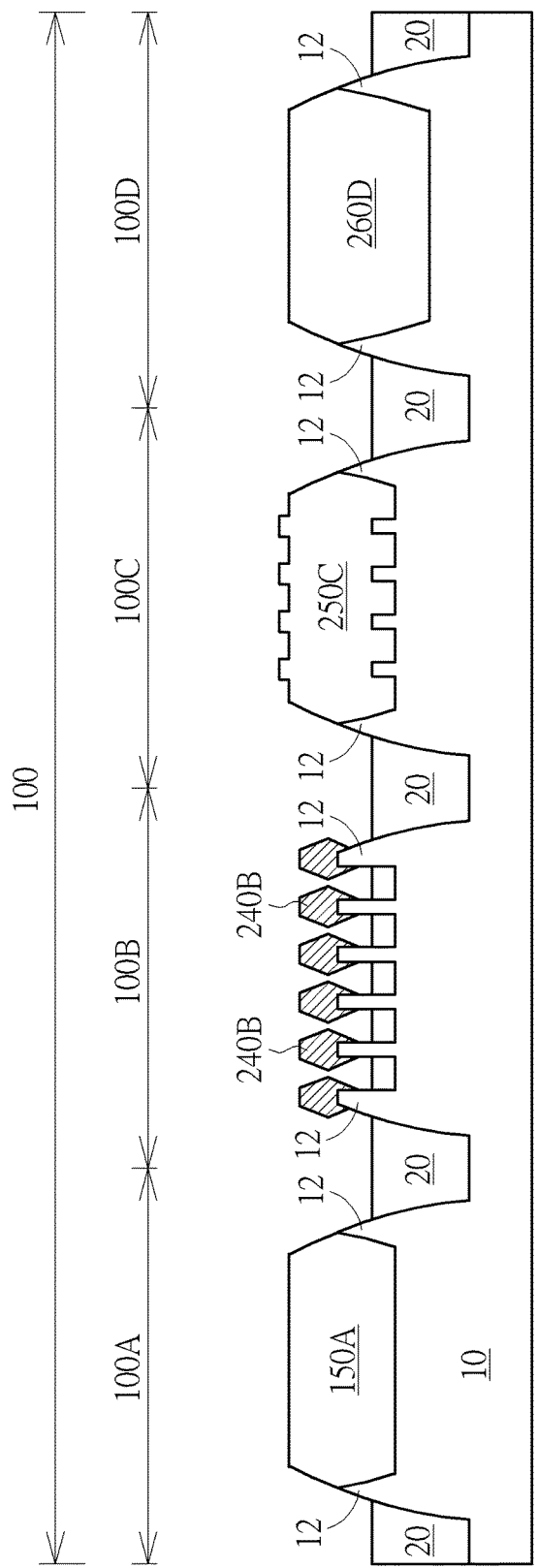
FIG. 9 shows the cross section diagram of the semiconductor structure according to the fourth preferred embodiment of the present invention.

It is noteworthy that, FIG. 9 only shows one example of the present invention, but the present invention is not limited thereto. In another case of the present invention, the shapes or amount of the epitaxial layers within a same conductivity type region can be adjusted according to actual requirements, and are not limited to the structure shown in FIG. 9.

In summary, the key feature of the present invention is the epitaxial layers with different shapes are disposed within different conductivity type regions of one semiconductor device, or the epitaxial layers with different shapes are disposed within one conductivity type region of one semiconductor device. By combining the epitaxial layers with different shapes in one semiconductor device, this improves the flexibility in the application.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate, a first conductivity type region and a second conductivity type region being defined thereon;
a plurality of first fin structures disposed on the substrate and disposed within the first conductivity type region, a plurality of second fin structures disposed on the substrate and disposed within the second conductivity type region;
a plurality of first gate structures disposed within the first conductivity type region, across and over the first fin structures, and a plurality of second gate structures disposed within the second conductivity type region, across and over the second fin structures; and
at least two first crown epitaxial layers, disposed within the first conductivity type region and disposed on two sides of each first gate structure, and a plurality of second epitaxial layers, disposed within the second conductivity type region and disposed on two sides of each second gate structure, wherein the second epitaxial layer comprises a teeth epitaxial layer, and the teeth epitaxial layer has a top surface with a recessed and protruding profile, and wherein the first crown epitaxial layers are disposed in a first recess on two sides of the first gate structure, the first recess has a flat bottom surface, and each one first crown epitaxial layer contacts the plurality of first fin structures, wherein a top surface of each first crown epitaxial layer is higher than a top surface of each first fin structure, in addition, the shape of the second epitaxial layer is different from the shape of the first crown epitaxial layer.

2. The semiconductor device of claim 1, wherein the first conductivity type region is a p-type transistor region, and the second conductivity type region is an n-type transistor region.

3. The semiconductor device of claim 1, wherein the first conductivity type region is an n-type transistor region, and the second conductivity type region is a p-type transistor region.

4. The semiconductor device of claim 1, wherein each first crown epitaxial layer has a flat bottom surface and a flat top surface.

5. The semiconductor device of claim 1, wherein each first crown epitaxial layer is disposed on the sidewalls of a plurality of first fin structures, and the first crown epitaxial layer does not cover and is not disposed right above each first fin structure directly.

6. The semiconductor device of claim 1, wherein the substrate at two sides of each second gate structure within the second region comprises a plurality of sub-fin structures, the sub-fin structures extend from the second fin structures, and a height of each sub-fin structure is smaller than a height of each second fin structure, and the teeth epitaxial layer directly covers and is disposed right above each sub-fin structure.

7. A semiconductor device, comprising:
a substrate, a first conductivity type region being defined thereon, the first conductivity type region including a first region and a second region;
a plurality of first fin structures disposed on the substrate and disposed within the first region, a plurality of second fin structures disposed on the substrate and disposed within the second region;
a plurality of first gate structures disposed within the first region, across and over the first fin structures, and a plurality of second gate structures disposed within the second region, across and over the second fin structures; and
at least two first crown epitaxial layers, disposed within the first region and disposed on two sides of each first gate structure, and a plurality of second epitaxial layers, disposed within the second region and disposed on two sides of each second gate structure, wherein the second epitaxial layer comprises a teeth epitaxial layer, and the teeth epitaxial layer has a top surface with a recessed and protruding profile, and wherein the first crown epitaxial layers are disposed in a first recess on two sides of the first gate structure, the first recess has a flat bottom surface, and each first crown epitaxial layer contacts the plurality of first fin structures, wherein a top surface of each first crown epitaxial layer is higher than a top surface of each first fin structure, in addition, the shape of the second epitaxial layer is different from the shape of the first crown epitaxial layer.

8. The semiconductor device of claim 7, wherein the first conductivity type region is a p-type transistor region or an n-type transistor region.

9. The semiconductor device of claim 7, wherein each first crown epitaxial layer has a flat bottom surface and a flat top surface.

10. The semiconductor device of claim 7, wherein each first crown epitaxial layer is disposed on the sidewalls of a plurality of first fin structures, and the first crown epitaxial layer does not cover and is not disposed right above each first fin structure directly.

* * * * *

UNITED STATES PATENT AND TRADEMARK OFFICE
CERTIFICATE OF CORRECTION

PATENT NO.       : 9,780,169 B2
APPLICATION NO.  : 14/876844
DATED            : October 3, 2017
INVENTOR(S)      : Chih-Kai Hsu et al.

It is certified that error appears in the above-identified patent and that said Letters Patent is hereby corrected as shown below:

On the Title Page

Item (73), correct the name of the assignee from "UNTIED MICORELECTRONICS CORP." to --UNITED MICROELECTRONICS CORP.--.

Signed and Sealed this
First Day of May, 2018

Andrei Iancu
*Director of the United States Patent and Trademark Office*